(12) United States Patent
Ralph et al.

(10) Patent No.: US 6,870,152 B2
(45) Date of Patent: Mar. 22, 2005

(54) SEGMENTED PHOTODETECTORS FOR DETECTION AND COMPENSATION OF MODAL DISPERSION IN OPTICAL WAVEGUIDES

(75) Inventors: Stephen E. Ralph, Atlanta, GA (US); Ketan Patel, Yardley, PA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/061,621

(22) Filed: Feb. 1, 2002

(65) Prior Publication Data

US 2003/0146370 A1 Aug. 7, 2003

(51) Int. Cl.[7] .................................................. G01J 4/00
(52) U.S. Cl. ............................. 250/227.18; 250/227.23
(58) Field of Search ....................... 250/227.18, 227.23, 250/227.24; 356/73.1, 300, 324; 385/8, 9

(56) References Cited

U.S. PATENT DOCUMENTS

| | | | | |
|---|---|---|---|---|
| 3,689,772 A | | 9/1972 | George et al. ............... 250/211 |
| 3,777,149 A | * | 12/1973 | Marcatili .................. 250/208.6 |
| 3,777,150 A | | 12/1973 | Miller ........................ 250/209 |
| 3,840,741 A | * | 10/1974 | Melchior ................. 250/214 R |
| 4,050,782 A | * | 9/1977 | Uchida et al. ................. 385/33 |
| 4,127,320 A | * | 11/1978 | Li ................................... 385/9 |
| 4,841,140 A | * | 6/1989 | Sullivan et al. ............. 250/226 |
| 4,945,230 A | * | 7/1990 | Saaski et al. ........... 250/227.21 |
| 4,999,489 A | * | 3/1991 | Huggins ...................... 250/226 |
| 5,099,114 A | * | 3/1992 | Matsumoto et al. ... 250/227.23 |
| 5,164,581 A | * | 11/1992 | Shiga ....................... 250/208.6 |
| 5,369,511 A | * | 11/1994 | Amos ........................... 359/15 |
| 5,625,729 A | * | 4/1997 | Brown ........................ 385/31 |
| 5,760,391 A | * | 6/1998 | Narendran ............. 250/227.14 |
| 6,400,450 B1 | * | 6/2002 | Golowich et al. ......... 356/73.1 |

OTHER PUBLICATIONS

Haas, Z. and Santora, M. (Jul. 1993) "A Mode–Filtering Scheme for Improvement of the Bandwidth–Distance Product in Multimode Fiber Systems", *Journal of Lightwave Technology*, vol. 11 (7), pp. 1125–1130.

Pending U.S. Appl. No. 10/061,837; filed Feb. 1, 2002, entitled "Compensation of Modal Dispersion in Optical Waveguides".

Shur, M.S. (1996) "MSM Photodetector" drawing, *Introduction to Electronic Devices*, Wiley Publishing.

* cited by examiner

*Primary Examiner*—Que T. Le
(74) *Attorney, Agent, or Firm*—Thomas, Kayden, Horstemeyer & Risley, LLP

(57) ABSTRACT

Systems for detection and compensation of modal dispersion in an optical fiber system including a multisegment photodetector coupled to an end of an optical fiber for detecting optical signals exiting the optical fiber and for converting the optical signals to an electrical output are provided. A representative multisegment photodetector includes a plurality of photodetector regions configured such that each of the plurality of photodetectors detects a portion of the plurality of optical signals exiting the end of the optical fiber and modifies the signal to reduce the affects of modal dispersion. Other systems are also provided.

21 Claims, 9 Drawing Sheets

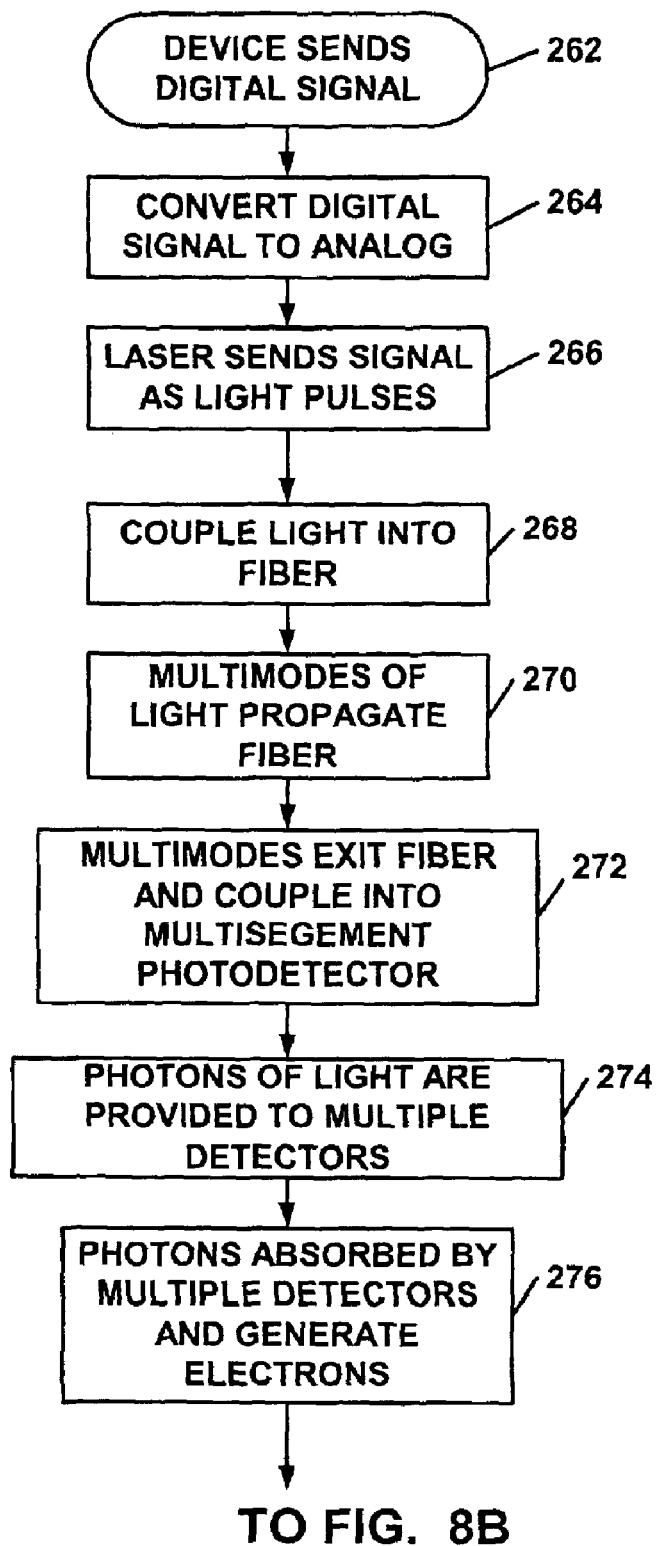

SEGMENTED PHOTODETECTORS FOR DETECTION AND COMPENSATION OF MODAL DISPERSION IN OPTICAL WAVEGUIDES

TECHNICAL FIELD

The present invention is generally related to optical fiber systems and, more particularly, is related to systems and methods for detection and compensation of modal dispersion or differential modal delay in optical waveguides.

BACKGROUND OF THE INVENTION

In an optical communication system deploying a multimode fiber, an optical signal launched into the fiber propagates along the fiber as multiple modes, each of which exhibits a different group velocity. A portion of the source optical signal resides in the different modes. The multiple modes can have different arrival times at the end of the fiber. The different group velocities of the modes cause a pulse formed from more than one mode to spread out as it propagates, and is referred to as intermodal dispersion which distorts the optical signal. Intermodal dispersion causes the optical signal initially launched through a fiber at a predetermined frequency and an initial phase to vary as a function of the length of the fiber.

Modal dispersion reduces the maximum data transmission rate of the optical communication system and thus diminishes the total transmission capacity of the fiber. This results from the fact that modal dispersion spreads the optical pulse as it propagates. Thus, short pulses are limited to very short transmission distances and longer pulses can be transmitted further since the relative distortion of the pulse is smaller. Since shorter pulses typically require more bandwidth, multimode fiber is characterized by a bandwidth-distance product. Importantly, the bandwidth-distance products of typical multimode fiber are severely limiting. Modem multimode fiber incorporates a graded optical index profile within the core of the fiber to reduce modal dispersion. Unfortunately, modal dispersion remains the dominant bandwidth limiting mechanism in multimode fibers. Furthermore, as compared to single mode fibers, these limits reduce the capacity of multimode fiber by orders of magnitude.

Thus, a heretofore unaddressed need exists in the industry to address the aforementioned and/or other deficiencies and/or inadequacies.

SUMMARY OF THE INVENTION

The present invention provides systems and methods that involve the use of segmented photodetectors for compensating for modal dispersion in multimode optical communications systems. Briefly described, one embodiment of the invention, among others, can be implemented as follows. A spatially distributed plurality of photodetector detection regions are used to detect different portions of a plurality of modes in a multimode optical fiber. Individually detected signals are modified using, for instance, amplitude or phase such that when individual signals are combined, the resulting output corresponds to, e.g., replicates, the input optical signal.

Another embodiment of the system includes a plurality of detection zones for detecting a plurality of modes of light incident on the plurality of detection zones. The plurality of detection zones are positioned adjacent to one another on a substrate and arranged in a coplanar, non-coplanar, annular or non-annular configuration. An optical element is arranged between the photodetector and an optical fiber to enhance the distribution of optical modes.

Other systems, methods, features, and advantages of the present invention will be or may become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 8A and 8B are flow charts depicting functionality or operation of the optical fiber system of FIG. 1.

DETAILED DESCRIPTION

Disclosed herein are methods and systems that involve segmented photodetectors for detection and compensation of modal dispersion in optical waveguides. To facilitate description of the inventive systems and methods, several example devices and methods that can be used to implement the segmented photodetectors are discussed with reference to the figures. Although the systems and methods are described in detail, it will be appreciated that the systems and methods are provided for purposes of illustration only and that various modifications are feasible without departing from the inventive concept. After the example systems have been described, an example of operation of a system will be provided to explain the manner in which the system can be used to provide the method for detection and compensation of modal dispersion in optical communications systems.

Figure 1:
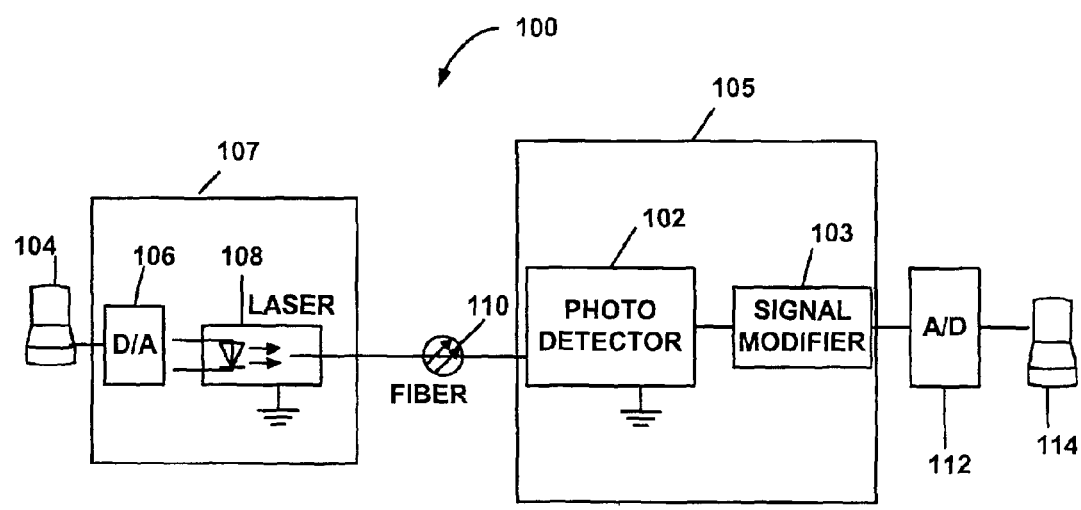
FIG. 1 is a schematic diagram of an optical fiber system including a photodetection system in accordance with an embodiment of this invention.

Referring now in more detail to the drawings, in which like numerals indicate corresponding parts throughout the several views, FIG. 1 is a schematic diagram of an optical fiber system 100 including a photodetector 102, such as a multisegment photodetector, for detection and compensation of modal dispersion in an optical fiber system 100 and a signal modifier 103 that compensates for the modal dispersion. The photodetector 102 and the signal modifier 103 encompass a photodetection system 105. The optical fiber system 100 includes a device 104 adapted to transmit an electrical digital signal, such as a computer. The digital signal is converted to an optical signal by an electrical-to optical (E-O) converter 107 which may include the use of a digital-to-analog converter 106 and light source, such as a laser 108. The light source from the laser 108 launches an optical signal into a multi-mode fiber 110. The optical signal propagates along the fiber 110. As the optical signal propagates in the fiber 110, multiple modes of light are formed with many travelling through the fiber 110 at different velocities. Typical, but not inclusive, wavelengths in which laser 108 operates includes 850 nanometers (nm) and/or 1300 nm. A suitable laser includes a vertical cavity surface emitting laser (VCSEL) that is well known in the art, but may also include light emitting diodes (LED), distributed feedback (DFB) laser or Fabry-Perot (F-P) lasers.

Positioned at the end of the fiber 110 is the photodetection system 105. Multiple modes of light exiting from the fiber 110 enter the multisegment photodetector 102. The multisegment photodetector 102, either with the use of varying biases to alter (relative to each other) the individual electrical signal of each multiple segment or separate signal modifier 103, the plurality of detected signals are altered and combined into one electrical output. The multisegment photodetector 102 outputs an electrical signal that, if converted to an optical signal, is substantially similar to the originally transmitted optical signal launched from the laser 108 into the fiber 110. It may be possible to implement any necessary alteration, or weighting factor, to the plurality of detected signal by the use of appropriate bias among the plurality of detection regions. However, external signal modifier 103 may be used to adjust the signal as necessary. The selection of weighting factors is chosen to reduce differences between the various modes. Moreover, weighting factors can be fixed or adjustable. This external signal modifier 103 can include electronic or mechanical devices such as attenuators, delay lines, amplifiers, and/or phase shifter. The output signal of the photodetection system 105 is then converted using an analog-to-digital converter 112 and then transmitted to a device that uses the digital signal, such as a computer 114.

Figure 2:
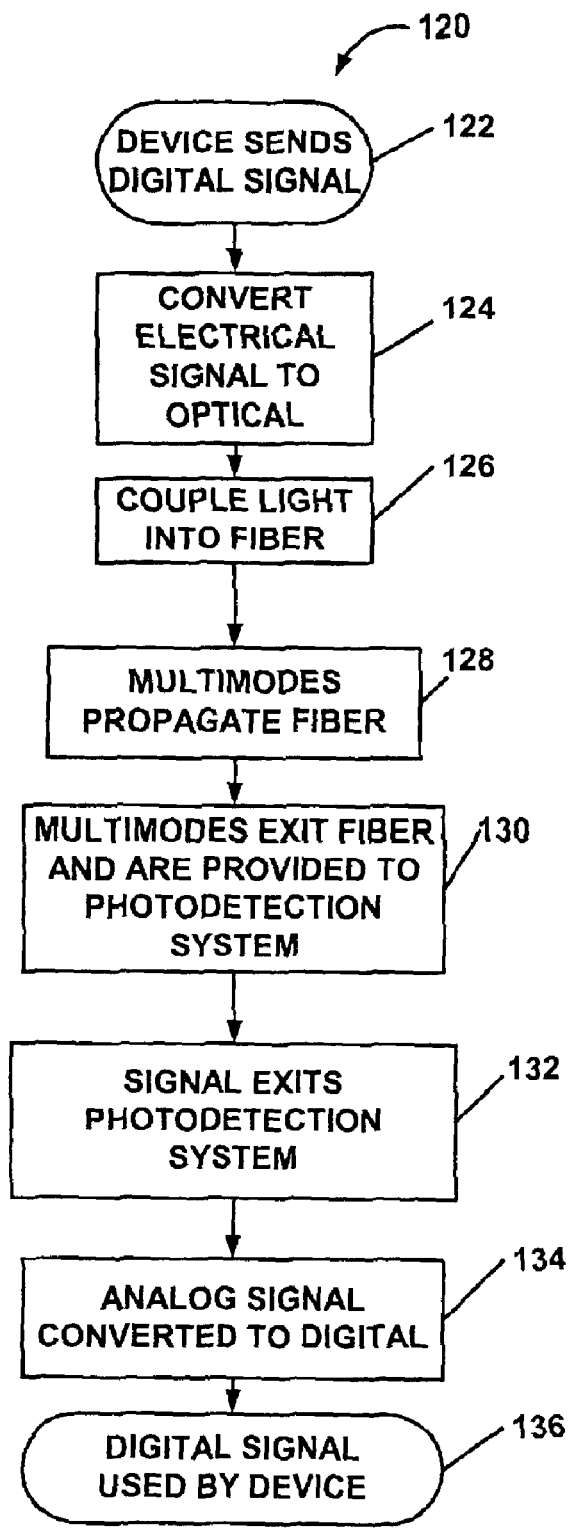
FIG. 2 is a flow chart depicting functionality or operation of the optical fiber system of FIG. 1.

FIG. 2 shows a flow chart 120 of processes encompassed by the optical fiber system 100 of FIG. 1. At 122, a device, such as a computer, sends a digital signal. At 124, the digital signal is converted to an optical signal using an digital-to-analog converter and laser. At 126, the optical signal is coupled into the fiber. At 128, the light propagates along the multi-mode fiber as various propagating modes, each traveling at a different velocity. At 130, the various propagating modes exit the fiber and encounter the photodetection system which converts the optical signal to multiple electrical signals. The electrical signals then can be modified accordingly and are combined. At 132, an electrical signal exits the photodetection system. At 134, the signal is converted from analog to digital by the analog-to-digital converter. At 136, the digital signal is used by a device, such as the computer shown in FIG. 1.

Figure 3:
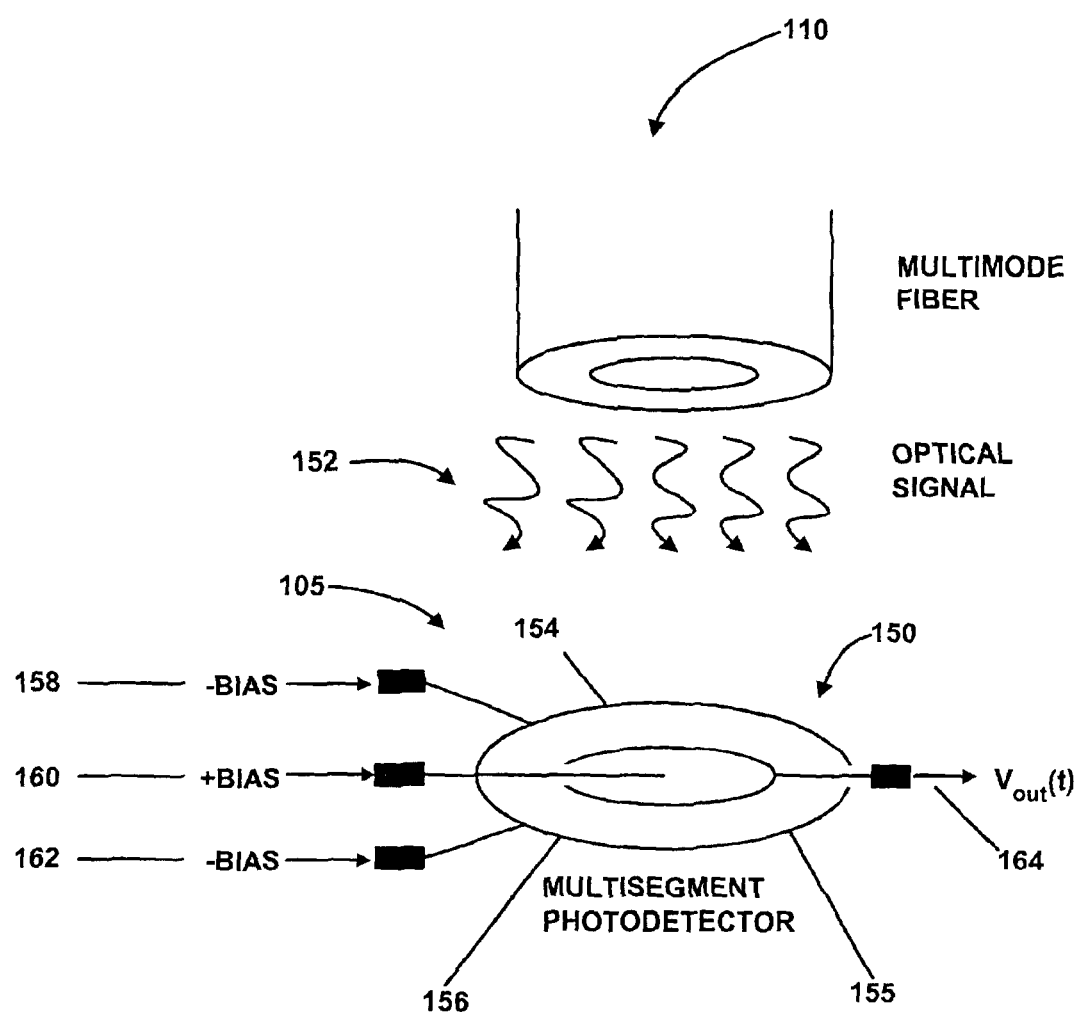
FIG. 3 is a schematic diagram of an embodiment of a photodetection system for use with the optical fiber system of FIG. 1.

FIG. 3 is a schematic diagram of an embodiment of a photodetection system 105 that could be used with the optical fiber system 100 of FIG. 1. The photodetection system 105 includes one embodiment of a multisegment photodetector 150. The multisegment photodetector 150 receives a plurality of optical signals 152 exiting the multi-mode fiber 110. The multisegment photodetector 150 may be shaped and arranged in a number of arbitrary manners. FIG. 3 shows an example of a multisegment photodetector 150 having coplanar, annular detector segments 154, 155, and 156. The invention is not limited to using coplanar, annular photodetection segments and may be used with non-planar, non-annular or non-concentric photodetector segments.

The multisegment photodetector 150 is not limited to the number of detector segments shown in the configuration of FIG. 3. Each individual detector of the multisegment photodetector 150 detects the plurality of optical signals 152 (also referred to as modes) differently according to each detector's position relative to the multi-mode fiber 110.

In FIG. 3, an example of a mechanism for adjusting the signals 152 is shown. The optical signals 152 carry a portion of the original optical signal launched in the fiber 110 by the laser 108 and a portion of interference optical modes caused by modal dispersion. Generally, a geometric configuration of the detector segments 154, 155 and 156 provides for isolating an optical signal 152, wherein the isolated signal is a combination of the original optical signal and interference signals generated from the multiple modes. The example of FIG. 3 shows three segments that receive bias 158, 160, and 162. For instance, segment 156 detects a combination of modes having the strongest portion of the original optical signal plus a moderately strong interference signal. This segment is positively biased 160 producing no change in the polarity of the mode.

Segment 155 detects a combination of modes having a weak portion of the original optical signal and a stronger interference signal. This segment is negatively biased 158 causing a change in polarity and producing a weak negative value for the original optical signal and a stronger negative value interference signal. Segment 154 detects a combination of modes having a weak portion of the original optical signal and a stronger interference signal. This segment is negative biased 162 causing a change in polarity and producing a weak negative value for the original optical signal and a stronger negative value interference signal. Combining these signals causes a cancellation of the interference signals and produces the output signal that closely approximated the optical signal originally launched into the fiber 110.

Bias 158, 160, and 162, such as a voltage, applied across the coplanar, annular segments 154, 155 and 156 of the multisegment photodetector 150 modifies the signals produced from the multisegment photodetector 150 and assist in the direction and flow of electrons producing an output, such as voltage $V_{out}(t)$ 164.

The biasing 158, 160 and 162 shown in FIG. 3 is a specific example of a weighting factor. The signals are weighted and their polarity is changed by bias to negative, positive, negative, 158, 160, and 162, respectively. When summed, the detected signals result in an output that can closely approximate the original optical signal coupled into the fiber 110.

In one embodiment, the modification made to the individually detected signal is by use of differing bias, magnitude and polarity of each photodetection zone. In an alternative embodiment, the modification is achieved by any combination of electrical and mechanical instruments used to impart changes in amplitude and/or phase to the electrical signal. Additionally, a number of diffractive or reflective optical elements may be positioned between the multi-mode fiber 110 and the multisegment photodetector 150.

Figure 4:
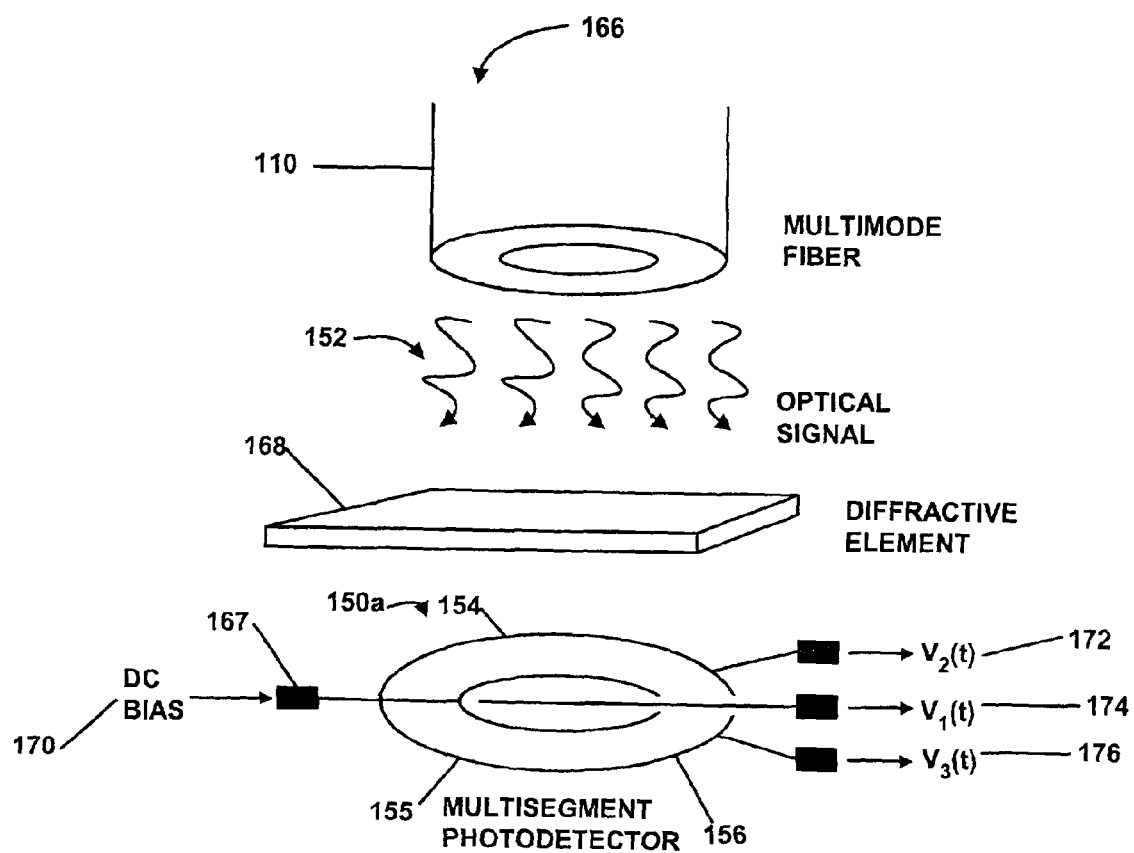
FIG. 4 is a schematic diagram of an alternative embodiment of a photodetection system for use with the optical fiber system FIG. 1.

FIG. 4 shows a schematic diagram 166 of an alternative embodiment of a photodetection system for use with the optical fiber system of FIG. 1. The photodetection system includes a multisegment photodetector 150a that receives a plurality of optical signals 152 from a multi-mode fiber 110. A number of diffractive or reflective optical elements may be positioned between the multi-mode fiber 110 and the multisegment photodetector 150a. For instance, a diffractive element 168 between the multisegment photodetector 150a and the multi-mode fiber 110 refocuses the optical signals 152 in a specific manner before the optical signals 152 enter the multisegment photodetector 150a. The intervening optical elements can include, but are not limited to, lenses, mirrors and/or holographic elements. The detector segment in this embodiment receives identical biases, and thus requires an additional, external means of applying the desired weighting factors required for compensation for modal dispersion.

In an alternative embodiment, a dc bias 170 across the external input contact 167 of the multisegment photodetector 150a directs the detected signals in a particular direction. As shown in FIG. 4, the diffractive element 168 affects a change in direction of the output signals 172, 174 and 176. For illustrative purposes only, three outputs 172, 174, and 176 exit the multisegment photodetector 150a. The multisegment photodetector 150a is not limited to producing only three output signals.

Figure 5:
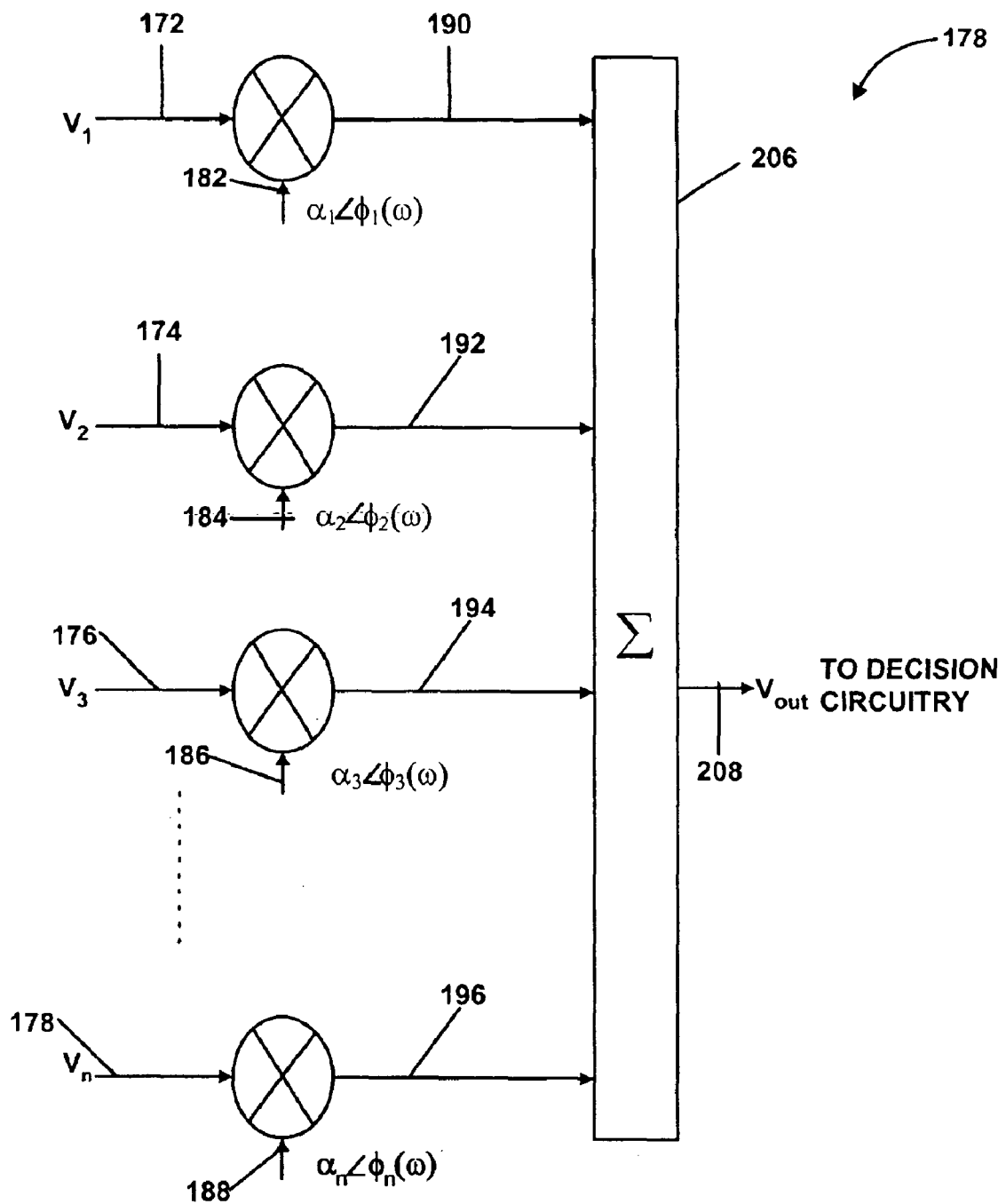
FIG. 5 is a schematic diagram of an embodiment of a configuration used to modify the signals from a multisegment photodetector of FIG. 3 and/or FIG. 4.

FIG. 5 is a schematic diagram of an embodiment of a configuration 178 used to modify the signals from the multisegment photodetector 150, 150a of FIG. 3 and/or FIG. 4. Signals ($V_1$, $V_2$, $V_3$ to $V_n$, 172, 174, 176 and 180, respectively) can be modified by weighting factors as discussed above including incorporating bias, attenuation, amplification and delay. For illustrative purposes, signals 172, 174, 176 and 180 experience an arbitrary vector scaling factor 182, 184, 186, and 188 as shown in FIG. 5. The signals 172, 174, 176 and 180 maybe subjected to another weighting factor or a combination of weighting factors. Interim outputs 190, 192, 194 and 196 are summed 206 to produce an output signal 208 that, if an equivalent optical signal, closely approximates the optical signal 108 originally coupled into the fiber 110. The output signal 208 can be used in a variety of manners including converting the signal to digital using an analog-to-digital converter 112 and then providing the signal to a device such as a computer 114 for use in a user's application.

Figure 6:
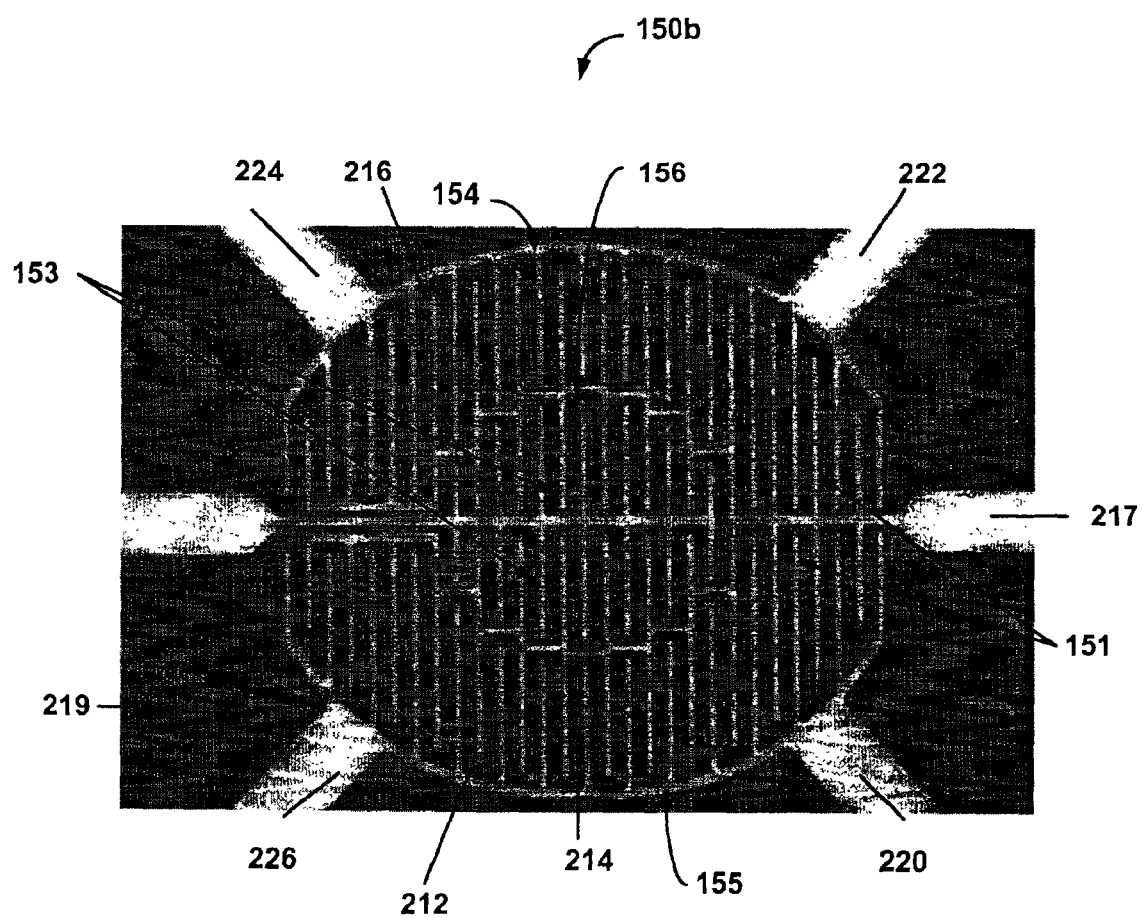
FIG. 6 shows a top view of an embodiment of a multisegment photodetector of the photodetection system of FIG. 1.

FIG. 6 shows a top view of an embodiment of a multisegment photodetector 150b that can be used in the photodetection system 105 of FIG. 1. In one embodiment, the multisegment photodetector 150 is a semiconductor device. The multisegment photodetector 150b includes multiple detection zones 151, 153 such as the outer and inner detection zones shown in FIG. 6. In one embodiment, the detection zones 151, 153 are positioned on a surface such as a substrate 219. The detection zones 151, 153 can be configured adjacent to each other yet electrically isolated from one another. Contacts may be included to provide a manner in which external elements connect to the multisegment photodetector 150b.

The detection zones 151, 153 sample the energy distribution of light from the optical signals 152 as a function of radius. The detection zones 151, 153 can be partitioned into multiple detection segments 154, 155 and 156 within the detection zones 151, 153. In one embodiment, the multiple segments 154, 155 and 156 are arranged in a concentric, coplanar, circular manner. In this embodiment, the segments 154, 155 that encompass the outer detection zone 151 surround the segment 156 that encompasses the inner detection zone 153. Other suitable configurations and/or geometries for the multiple segments 154, 155 and 156 and/or the detection zones 151, 153 that can be used in the design and isolation of signals 152 exiting the fiber 110 include, but are not limited to, square, solid, and/or annular. The geometric pattern of the multisegment photodetector 150b is designed based upon factors such as, the number of photodetectors desired, the shape of the fiber, and the shape of the light modes exiting the fiber. The concentric pattern shown in FIG. 6 keeps the overall size of the photodetector small, and generally requires less area for the same cross-sectional dimensions of width and height. However, the overall size of the multisegment photodetector 150b relative to the fiber 110 can vary.

In one embodiment, each of the segments 154, 155 and 156 is fabricated using interdigitated, planar metal-semiconductor-metal (MSM) technology. As shown in FIG. 6, the interdigitated electrode structure 212 conforms to the geometric shape of multiple segments 154, 155 and 156 and are concentric, coplanar circular structures. The photodetector presented here is made with interdigitated, planar metal-semiconductor-metal (MSM) technology. The invention is not limited to MSM technology and may include any combination of non-planar, non-annular and/or non-MSM detection technology including, but not limited to PIN detectors. Additionally, there are three primary photodetection regions 154, 155 and 156 but this invention can be segmented into any number larger than one.

The embodiment described here for the modification to the individual detected signal involves the use of differing bias magnitude and polarity for each photodetection region 154, 155 and 156. However, the modification may be achieved by any combination of electrical and mechanical instruments that impart changes in amplitude and phase to the electrical signal, including magnitude and polarity of bias used on each detection region.

The determination of specific modification to be applied to each detected signal may be done in several ways including, but not limited to, the use of fixed, arbitrary settings; the use of techniques during which a known signal is transmitted and the modification are set systematically or randomly until the detected output replicates the known signal; or by the use of computing (analog or digital) hardware to apply adjustments to the detected signals to satisfy any other criteria set by the user of designer of the system.

The interdigitated electrode structure 212 is configured to increase, e.g., maximize, the light reaching the conductive layer of the multisegment photodetector 150b while reducing, e.g., minimizing, transit time of electrons being transported across the multisegment photodetector 150b. The interdigitated electrode structure 212 includes lines 214 having the conductive material surrounded by an electrically neutral zones 216 where the substrate is exposed. The electrically neutral zones 216 provide for the electrical isolation of detection zones 151, 153.

The multisegment photodetector 150b includes a plurality of channels 220, 222, 224 and 226. In one embodiment, detected signals can exit the multisegment photodetector 150b at channel 217. In an alternative embodiment, detected signals return in a channel 220, 222, 224 and 226 back to a detection zone 151, 153 for further modification or exit the multisegment photodetector 150b for use by subsequent electronics.

In one embodiment, photons incident to one detection zone 151 are processed by that detection zone 151 and photons incident to another detection zone 153 are processed by that detection zone 153. By handling photons in this manner, the multisegment photodetector 150b of this invention provides for isolating and correcting multiple signals and may modify the shape of a signal to diminish the effect of the multi-mode fiber 110.

In one embodiment, the multisegment photodetector is a metal-semiconductor-metal type multisegment photodetector. MSM type photodetectors have operating characteristics of high responsivity and speed. Responsivity is the measure of the effectiveness of a device in converting incident light to an output current. Speed is the measure of how quickly an output of the device changes in response to a change in the input to the device. One type of MSM photodetector includes one having an absorbent layer of Gallium Arsenide (GaAs) or Indium Gallium Arsenide (InGaAs). It should be noted, however, that MSM technology is not required and other photodetector technologies, such as PIN also are applicable.

Figure 7:
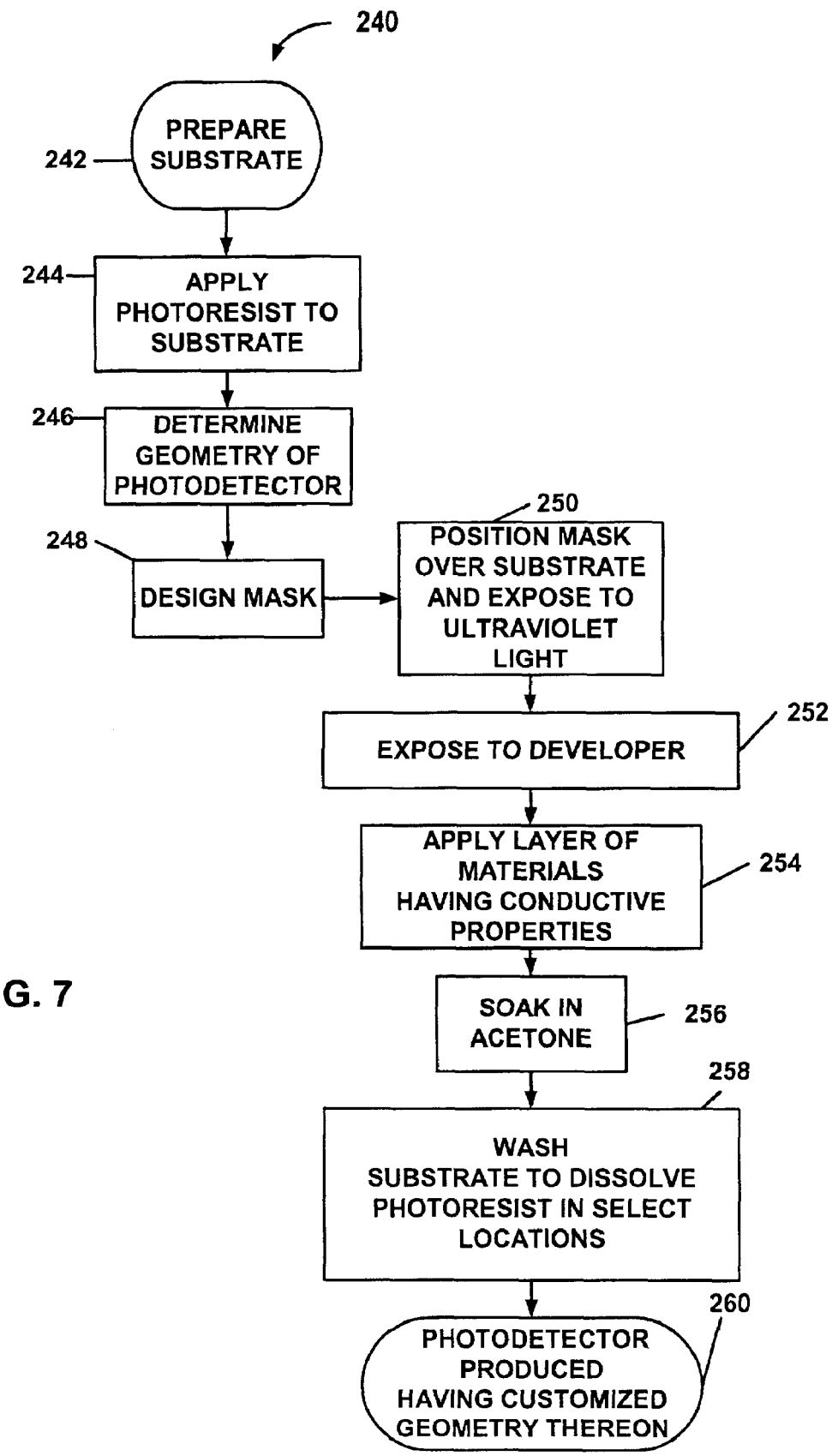
FIG. 7 is a flow chart depicting an embodiment of a process of fabricating the multisegment photodetector of the photodetection system of FIG. 6.

FIG. 7 is a flow chart 240 depicting an embodiment of a process of fabricating a multisegment photodetector 150b of FIG. 6. The multisegment photodetector 150b includes photodiodes fabricated on a substrate. In one embodiment, the substrate is made of silicon. Other suitable substrates may be used such gallium arsenide or indium gallium arsenide. At 242, a substrate is prepared. The substrate may be of any operable thickness, but is typically about 50 micrometers thick for a 6 inch-diameter wafer. At 244, a photoresist is applied to substrate. The photoresist is a chemical, e.g., Clarient AZ5214E, that reacts to ultraviolet light. An area covered with photoresist and exposed to ultraviolet light will dissolve leaving the material below the photoresist exposed, which in this case is the substrate. At 246, a geometry of the photodetector 150b is determined. Factors used in determining the geometry of the photodetector include for instance, the number of detectors desired, the size of the fiber and the shape of the light hitting the photodetector. At 248, a mask is designed. The mask is a pattern tool that provides for depositing materials onto the substrate that make up the particular geometry of the photodetector as determined in step 246.

At 250, the mask is positioned over the substrate and the entire structure is exposed to ultraviolet light. At 252, a developer is applied onto the structure. The developer is used to wash away portions of the photoresist exposed to ultraviolet light. Areas having photoresist not exposed to ultraviolet light will not wash away and the photoresist will remain on those portions of the substrate. At 254, a layer of materials having conductive properties is applied. For instance, a layer of, but not limited to, titanium and gold can be applied.

At 256, the structure is soaked in acetone. At 258, the structure is washed to dissolve the photoresist. The locations having the photoresist and any material deposited thereon washes away leaving the substrate exposed in particular locations. The conductive material remains in other select locations. At 260, the fabrication of a photodetector is completed producing a multisegment photodetector having a customized geometry thereon.

Figure 8B:
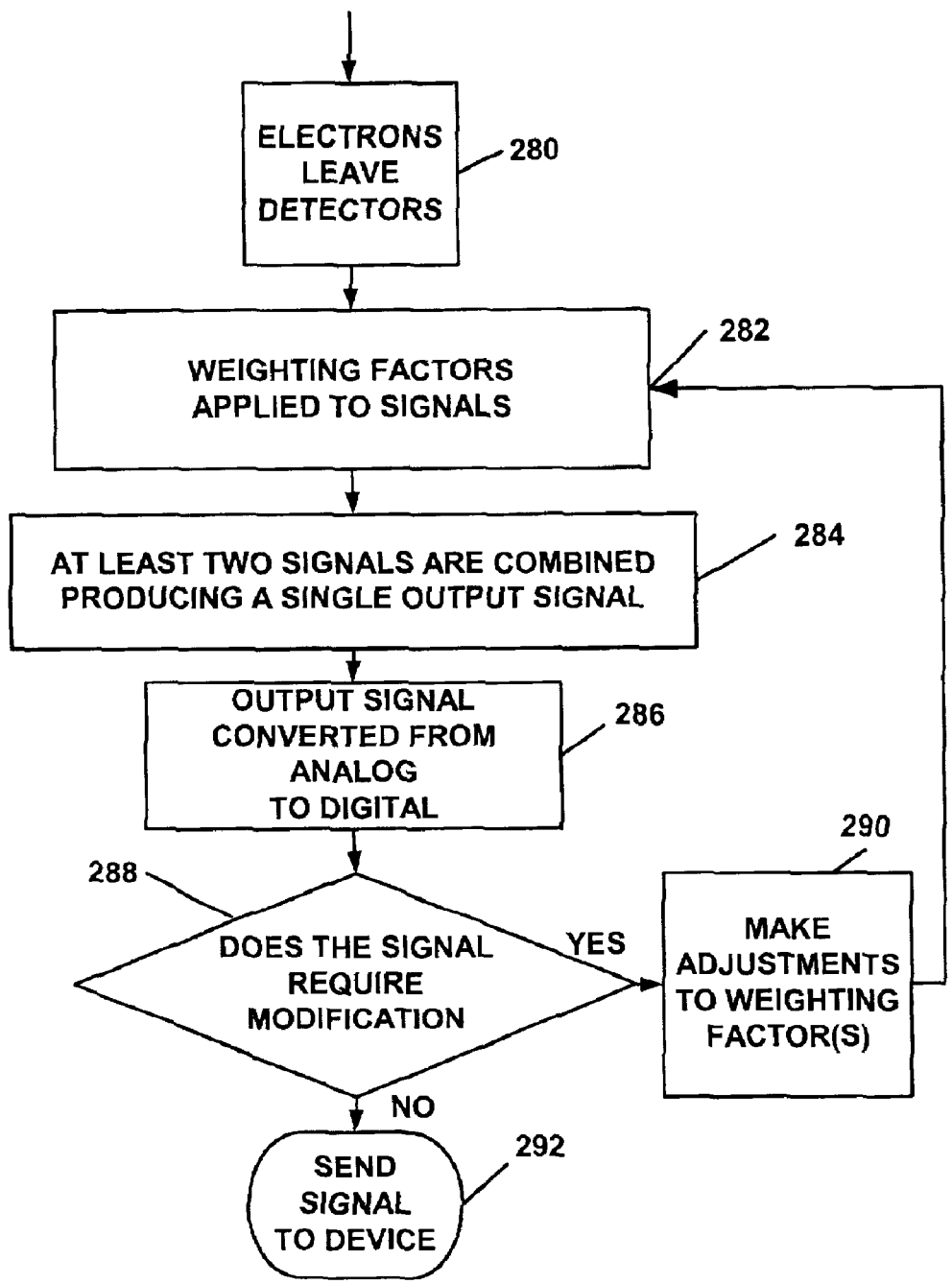

FIGS. 8A and 8B are flow charts depicting functionality or operation of the optical fiber system 100 of FIG. 1. Referring to FIG. 8A, at 262, a device such as a computer sends a digital signal. At 264, the digital signal is converted to an analog signal for use in the optical fiber system. At 266, a laser sends the signal as light pulses. At 268 the light is coupled into a multi-mode fiber. The light radiates as multiple modes, and at 270, the multiple modes of light propagate the fiber. The multiple modes of light exit the fiber, at 272 and couple into the multisegment photodetector. Alternatively, the multiple modes of light enter a diffraction element positioned between the multi-mode fiber and the multisegment photodetector. At 274, the photons of light hit the multiple detectors of the multisegment photodetector. At 276, the photons are absorbed by the multiple detectors and generate electrons that can be used as a current or converted to voltage.

Referring to FIG. 8B, at 280 the electrons leave the multiple detectors. At 282, signal(s) enter a weighting factor that modifies the signal. At 284, in a system having at least two modified signals, the modified signals are combined producing an output signal. At 286, the output signal can be converted from analog to digital. It may be determined either during real-time use of the optical network or before such as during a "training session" that adjustments must be made on the modification made upon the plurality of signals. In this event, the error in the output signal, computed by comparison to a known copy of the transmitted signal or some other error estimating algorithm, and the weighting factors used in step 282 are altered at 290, such that the error is minimized as necessary. This process may be iterative according to the algorithm used at 290. At 292, the signal is sent to a device, such as a computer for use in a user's application.

A potential advantage of the present invention is that it accepts the effects of the multi-modes exiting the fiber and uses an inventive photodetection system to determine the effect of differential mode delay and compensate for and reduce the effect of the modal delays. The result is an output signal that can closely approximate the original signal coupled into the fiber.

It should be emphasized that the above-described embodiments of the present invention, are merely possible examples of implementations, merely set forth for a clear understanding of the principles of the invention. Many variations and modifications may be made to the above-described embodiment(s) of the invention without departing substantially from the spirit and principles of the invention. For example, the weighting factors as discussed above may be arbitrarily chosen or may be set by a "training" process. During the training process a known signal is sent through the multisegment photodetector and the weighting factors are adjusted until the output matches the transmitted signal. This "training" may be performed as needed to correct for modal dispersion. The matching process may be performed manually or by an electronic feedback mechanism. All such modifications and variations are intended to be included herein within the scope of this disclosure and the present invention and protected by the following claims.

Therefore, having thus described the invention, at least the following is claimed:

1. A photodetector, comprising:
    a plurality of detection zones for detecting a plurality of modes of light incident on the plurality of detection zones, the plurality of detection zones positioned adjacent to one another on a substrate and arranged in a coplanar, annular configuration;
    a plurality of segments located within the detection zones, each of the segments being adapted to detect the plurality of modes and convert the plurality of modes into a plurality of electrical signals; and
    a plurality of signal modifiers to compensate for interference in the plurality of electrical signals caused by modal dispersion in the plurality of modes, each of the signal modifiers applying a weighting factor to the plurality of electrical signals from a respective segment according to a level of interference that is present in the plurality of electrical signals, wherein the plurality of electrical signals from a respective segment are biased to change the polarities of the electrical signals from the respective segment based on the level of interference present in the respective electrical signals so that the interference is suppressed when combined with other electrical signals from other segments.

2. The photodetector of claim 1, wherein the plurality of segments further comprises interdigitating, planar metal-semiconductor-metal (MSM).

3. The photodetector of claim 1, wherein the plurality of detection zones are concentric, annular detection zones.

4. The photodetector of claim 1, wherein in the plurality of detection zones, one detection zone detects a combination of modes that is substantially distinct from a mode of light detected by other detection zones.

5. The photodetector of claim 1, wherein the substrate comprises nonconductive material.

6. The photodetector of claim 1, wherein the plurality of segments are comprised of doped semiconductor materials creating a PIN structure.

7. The photodetector of claim 1, further comprising an optical element placed between the photodetector and a fiber for enhancing the separation of a plurality of modes by the plurality of detection zones.

8. The photodetector of claim 1, wherein the optical element comprises a diffractive element.

9. The photodetector of claim 1, wherein the optical element comprises a binary diffractive element.

10. The photodetector of claim 1, wherein the optical element comprises a holographic element.

11. A system for correcting modal dispersion in an optical fiber system, comprising:

a multisegment photodetector coupled to an end of an optical fiber for detecting optical signals exiting the optical fiber and for converting the optical signals to an electrical output, the multisegment photodetector including a plurality of photodetector regions configured such that one of the plurality of photodetector regions intercepts a mode in a manner distinct from another of the plurality of photodetector regions and converts the mode into an electrical signal; and a plurality of signal modifiers to compensate for effects of modal dispersion in the optical fiber, each signal modifier configured to adjust the strength of a respective electrical signal according to a level of interference that is present in the respective electrical signal from a respective photodetector region, wherein the respective electrical signal is biased to change the polarity of the respective electrical signal based on the level of interference present in the respective electrical signal such that the interference is suppressed when combined with other electrical signals from other regions of the plurality of photodetectors regions.

12. The system of claim 11, wherein the plurality of photodetector regions comprise an array of coplanar, annular regions.

13. The system of claim 11, wherein the plurality of photodetector regions further comprises coplanar, circular sections having a plurality of interdigitated, planar MSM segments.

14. The system of claim 11, wherein the plurality of photodetector regions further comprises a plurality of interdigitated segments representing a conductive portion of the plurality of photodetector regions.

15. The system of claim 11, wherein the plurality of photodetector regions further comprises a plurality of doped semiconductor materials creating a PIN structure.

16. The system of claim 11, further comprising a diffractive element coupled between the multisegment photodetector and the end face of the optical fiber for directing the optical signals into the multisegment photodetector.

17. The system of claim 11, further comprising an output circuit coupled to the plurality of photodetector regions for modifying signals from the plurality of photodetector regions and producing a signal substantially similar to an optical signal coupled into the optical fiber.

18. The system of claim 17, further comprising an optical signal launched into the optical fiber.

19. The system of claim 11, further comprising a network selected from the group consisting of attenuators, amplifier, phase shifters and transmission lines that modify a plurality of detected signals, individually, and subsequently combining the modified detected signals to reproduce, as closely as possible, the originally transmitted signal.

20. The system of claim 11, further comprising a network for performing digital signal processing on a plurality of detected signals, individually, and subsequently combining the modified detected signals to reproduce, as closely as possible, the originally transmitted signal.

21. A photodetector system for use in an optical fiber system, comprising:

means for individually detecting a plurality of modes exiting an optical fiber;

means for converting a combination of modes from the plurality of modes exiting the optical fiber into an electrical output; and means for iteratively adjusting the strength of the electrical output to minimize effects of modal dispersion by combining different electrical outputs into an output signal and making adjustments based on output signal error.

* * * * *